United States Patent
Sudo

(10) Patent No.: US 11,813,717 B2
(45) Date of Patent: Nov. 14, 2023

(54) METHOD OF GRINDING WORKPIECE

(71) Applicant: DISCO CORPORATION, Tokyo (JP)

(72) Inventor: Yujiro Sudo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 496 days.

(21) Appl. No.: 17/118,741

(22) Filed: Dec. 11, 2020

(65) Prior Publication Data

US 2021/0187689 A1 Jun. 24, 2021

(30) Foreign Application Priority Data

Dec. 20, 2019 (JP) ................................. 2019-230813

(51) Int. Cl.
 *B24B 7/07* (2006.01)

(52) U.S. Cl.
 CPC ..................................... *B24B 7/07* (2013.01)

(58) Field of Classification Search
 CPC .. B24B 7/04; B24B 7/07; B24B 7/075; B24B 7/22; B24B 7/228; B24B 41/06; B24B 41/068; B24B 37/00; B24B 37/005; B24B 37/013; B24B 37/04; B24B 37/042; B24B 37/046; B24B 37/07; B24B 37/10; B24B 37/34; B24B 37/105; B24B 37/107
 USPC ...................................................... 451/28, 41
 See application file for complete search history.

(56) References Cited

U.S. PATENT DOCUMENTS 5,567,199 A 10/1996 Huber et al.
2018/0369990 A1* 12/2018 Takenouchi ............. B24D 7/10

FOREIGN PATENT DOCUMENTS

| JP | 2004351553 A | | 12/2004 |
|---|---|---|---|
| JP | 2005022059 A | | 1/2005 |
| JP | 2005052955 A | | 3/2005 |
| JP | 2009090389 A | | 4/2009 |
| JP | 2016111143 A | | 6/2016 |
| JP | 2017071032 A | * | 4/2017 |

OTHER PUBLICATIONS

JP2017071032—Machine Translation (Year: 2017).*
EP Search report issued in counterpart European patent application No. 20 21 4584, dated May 3, 2021.
Search report issued in counterpart Singapore patent application 10202011978U, dated Nov. 26, 2021.
Japanese translated Office Action for corresponding Japanese Patent Application No. 2019-230813 dated Aug. 15, 2023 (4 pages).

* cited by examiner

*Primary Examiner* — Joel D Crandall
*Assistant Examiner* — Alberto Saenz
(74) *Attorney, Agent, or Firm* — Greer, Burns & Crain, Ltd.

(57) ABSTRACT

A method of grinding a workpiece includes a holding step of holding the workpiece on a flat holding surface of a holding table and a grinding step of rotating a grinding wheel to turn grindstones along an annular track while rotating the holding table, and bringing the grindstones into grinding contact with an upper surface of the workpiece to thereby grind the workpiece. The grinding step includes the step of bringing the grindstones into grinding contact with the upper surface of the workpiece in a state where the annular track is closest to the holding surface in an area between a point above a center of the holding surface and a point above an outer circumferential end of the holding surface.

4 Claims, 8 Drawing Sheets

METHOD OF GRINDING WORKPIECE

BACKGROUND OF THE INVENTION

Field of the Invention

The present invention relates to a method of grinding a workpiece with grindstones to planarize a ground surface of the workpiece.

Description of the Related Art

Silicon-carbide (SiC) wafers shaped as circular plates, for example, are used to manufacture device chips incorporating power devices that are capable of operating at high temperatures and withstanding high voltages and devices such as large-scale-integration (LSI) circuits. An SiC wafer with a plurality of devices formed on its face side is divided into individual device chips having respective devices. An SiC wafer shaped as a circular plate is manufactured by being cut off from a cylindrical SiC ingot, e.g., a hexagonal single crystal ingot. For example, a laser beam having a wavelength transmittable through SiC is applied to an end face of the SiC ingot while a converged spot of the laser beam is being positioned in the SiC ingot at a depth corresponding to the thickness of an SiC wafer to be produced from the end face of the SiC ingot. The applied laser beam separates SiC into Si and C and extends cracks along a c-plane in the SiC ingot, forming modified layers at the depth. Then, the SiC wafer is cut off from the SiC ingot along the modified layers that act as a peel-off starting point (see, for example, Japanese Patent Laid-open No. 2016-111143).

An SiC ingot is manufactured by growing an SiC seed crystal into a cylindrical ingot growth base that has a growth end face on its distal end and cutting off a distal-end portion of the ingot growth base that includes the growth end face. The ingot growth base is cut with a wire saw, for example. The SiC ingot has minute surface irregularities on both the cut surface and the growth end face. If a laser beam is applied to the SiC ingot as it is in order to produce an SiC wafer therefrom, then since the laser beam is disturbed by the minute surface irregularities on the cut surface or the growth end face, modified layers are unlikely to be formed as desired. Therefore, it has been customary to grind the growth end face and the cut surface of the SiC ingot cut off from the ingot growth base, for removing minute surface irregularities therefrom.

There are known in the art various grinding apparatuses for grinding workpieces. The grinding apparatuses commonly include a holding table having an upper surface as a holding surface for holding a workpiece thereon and a grinding unit disposed above the holding table. The grinding unit includes a grinding wheel with an annular array of grindstones mounted thereon. The holding table is rotatable about a table axis at the center of the holding surface, and the grinding wheel is also rotatable about a wheel axis at the center thereof to turn the grindstones along an annular track. For grinding a workpiece on the grinding apparatus, the workpiece is placed on the holding table and held under suction thereon by a negative pressure applied between the workpiece and the holding surface. Then, the holding table and the grinding wheel are rotated individually, and the grinding unit is lowered to bring the grindstones as they turn along the annular track into grinding contact with an upper surface of the workpiece, thereby grinding the upper surface of the workpiece with the grindstones. In order to grind the upper surface of the workpiece efficiently to a high-quality finish, the holding surface of the holding table is a slightly inclined conical surface.

The holding table and the grinding unit are preadjusted in terms of position and orientation such that the generatrix of the conical holding surface of the holding table and the annular track followed by the grindstones will be kept parallel to each other and that the annular track will overlap the center of the holding surface of the holding table. When the workpiece is held under suction on the holding surface, the workpiece is deformed into a shape complementary to the conical shape of the holding surface. When the grinding unit is lowered while the holding table and the grinding unit are being rotated, the grindstones contact the upper surface of the workpiece in a grinding area extending from the outer circumference to the center of the upper surface of the workpiece.

SUMMARY OF THE INVENTION

In attempts to grind a hard and thick workpiece such as an SiC ingot on a grinding apparatus, the workpiece is less likely to be deformed into a shape complementary to the conical shape of the holding surface of the holding table even when a negative pressure is applied between the workpiece and the holding surface to hold the workpiece under suction on the holding surface. Therefore, the workpiece may fail to be attracted under suction to the holding table, the thickness of the ground workpiece may have poor accuracy, and the upper surface of the workpiece may be ground with uneven levels of grinding strength. Stated otherwise, it is not easy to grind hard and thick workpieces adequately.

It is therefore an object of the present invention to provide a method of grinding a hard and thick workpiece adequately.

In accordance with an aspect of the present invention, there is provided a method of grinding a workpiece on a grinding apparatus including a holding table having on an upper portion thereof a holding surface for holding a workpiece under suction thereon, the holding table being rotatable about a table axis extending through a center of the holding surface, a grinding unit disposed above the holding table, the grinding unit having a grinding wheel with an annular array of grindstones for grinding the workpiece held on the holding table and an electric motor for rotating the grinding wheel about a wheel axis, the grindstones being turned along an annular track overlapping the center of the holding surface when the electric motor rotates the grinding wheel, and a lifting and lowering unit for moving the grinding unit and the holding table relatively to each other along directions in which the table axis extends. The method includes a holding step of holding the workpiece on the holding surface of the holding table, the holding surface being flat, and a grinding step of rotating the grinding wheel about the wheel axis to turn the grindstones along the annular track while rotating the holding table about the table axis, and actuating the lifting and lowering unit to bring the grinding unit and the holding table relatively toward each other until the grindstones are brought into grinding contact with an upper surface of the workpiece to thereby grind the workpiece. In the grinding step, the annular track is inclined to the holding surface of the holding table, and the grinding step includes the step of bringing the grindstones into grinding contact with the upper surface of the workpiece in a state where the annular track is closest to the holding surface in an area between a point above the center of the holding surface and a point above an outer circumferential end of the holding surface.

Preferably, in the grinding step, the annular track is closest to the holding surface at an intermediate point between the point above the center of the holding surface and the point above the outer circumferential end of the holding surface.

In the method of grinding a workpiece according to the aspect of the present invention, the grinding apparatus includes the holding table having the flat holding surface. Therefore, unlike a holding table having a conical holding surface, the holding table according to the aspect of the present invention does not require that the workpiece be deformed into a conical shape when the workpiece is held on the holding surface, and is able to adequately hold a hard and thick workpiece on the holding surface. In the method of grinding a workpiece according to the aspect of the present invention, the annular track is inclined to the holding surface of the holding table, and the workpiece is ground in the state where the annular track is closest to the holding surface in the area between the point above the center of the holding surface and the point above the outer circumferential end of the holding surface. With this arrangement, the upper surface to be ground of the workpiece can be ground efficiently to a high-quality finish in the same manner as if the holding surface were a conical surface.

Accordingly, the present invention provides a method of grinding a hard and thick workpiece adequately.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 2:
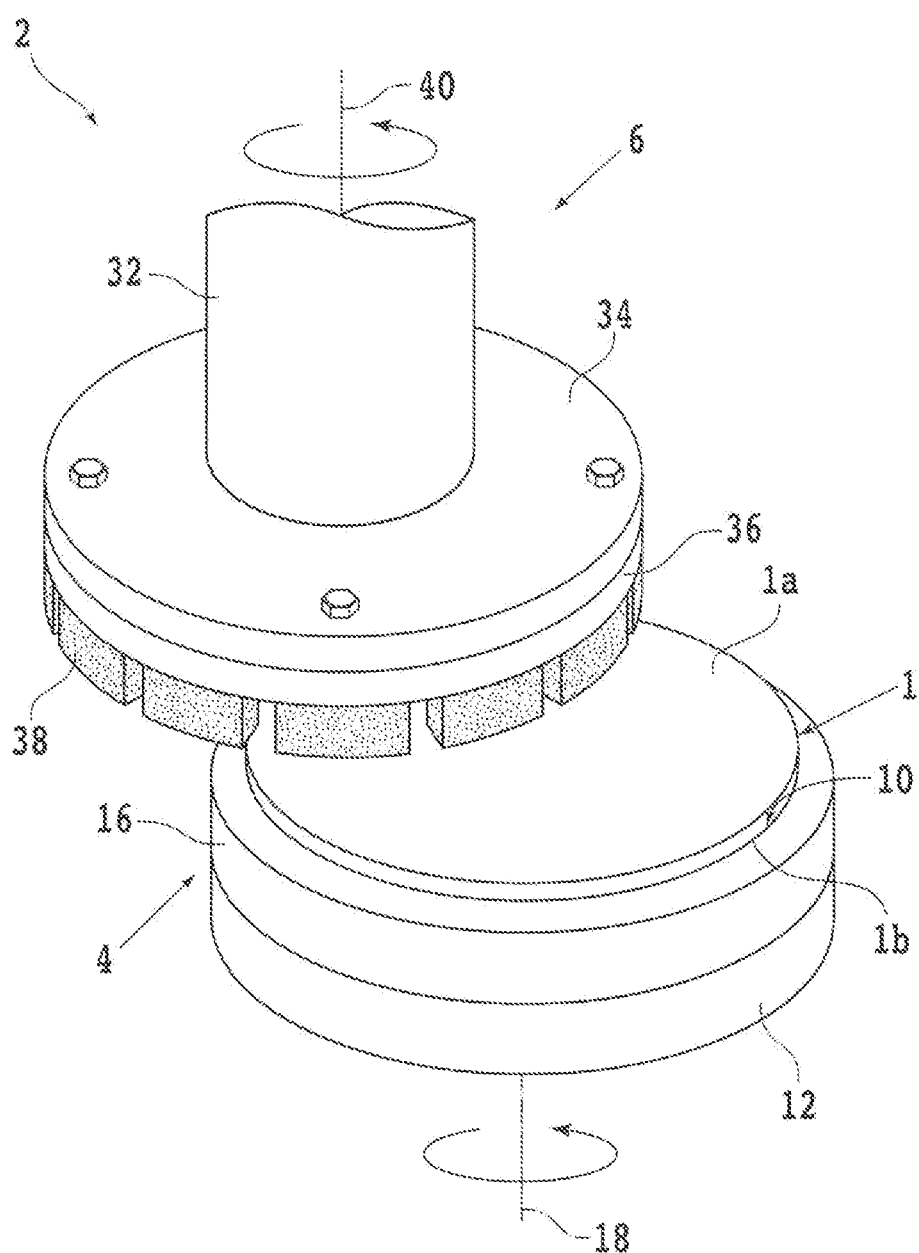
FIG. 2 is a perspective view, partly in cross section, schematically illustrating the grinding unit and a holding table for holding a workpiece under suction thereon.

A method of grinding a workpiece according to an embodiment of the present invention will hereinafter be described with reference to the drawings. In the method of grinding a workpiece according to the embodiment, which is also referred to as a workpiece grinding method, a workpiece is ground to a thinned configuration by a grinding apparatus. First, the workpiece will be described below. FIG. 2 illustrates the workpiece, denoted by 1, in perspective. The workpiece 1 is in the form of a substantially cylindrical ingot or the like that is made of silicone (Si), SiC, gallium nitride (GaN), gallium arsenide (GaAs), any of various semiconductor materials, or the like, for example. The ingot is cut to produce a wafer shaped as a circular plate. Then, a plurality of devices are formed in rows and columns on a face side of the wafer, which is divided into individual device chips including the respective devices.

In recent years, attention has been paid to an SiC wafer as a wafer used to manufacture device chips incorporating power devices that are capable of operating at high temperatures and withstanding high voltages and devices such as LSI circuits. An SiC wafer is formed by being cut off from an SiC ingot, e.g., a hexagonal single crystal ingot. For manufacturing an SiC ingot, an SiC seed crystal is grown into a cylindrical ingot growth base having a growth end face on its distal end. Then, the ingot growth base is cut by a wire saw or the like, producing a cylindrical SiC ingot.

For cutting the SiC ingot, a laser beam that is transmittable through SiC is applied to an end face of the SiC ingot. At this time, a converged spot of the laser beam is positioned in the SiC ingot at a depth corresponding to the thickness of an SiC wafer to be produced from the end face of the SiC ingot, while at the same time the converged spot is moved horizontally relatively to the SiC ingot. The applied laser beam separates SiC into Si and C and extends cracks along a c-plane in the SiC ingot, forming modified layers at the depth. Then, the SiC wafer is cut off from the SiC ingot along the modified layers that act as a peel-off starting point. Thereafter, the laser beam is applied again to the SiC ingot from which the SiC wafer has been peeled off, and a next SiC wafer is peeled off from the SiC ingot. In this manner, SiC wafers are successively formed from the SiC ingot.

However, if the surface of the SiC ingot to which the laser beam is applied is rough and has surface irregularities, the laser beam is disturbed by the surface to which it is applied and cannot adequately be converged. Therefore, the SiC ingot cut off from the ingot growth base by the wire saw or the SiC ingot from which the SiC wafer has been peeled off along the modified layers that act as a peel-off starting point is ground to remove the surface irregularities. In addition, the SiC wafer obtained from the SiC ingot is also ground to remove surface irregularities from the cut surface of the SiC wafer. The workpiece 1, which may be the SiC ingot, the SiC wafer peeled off therefrom, or the like is ground by a grinding apparatus 2 illustrated in FIG. 1. While the grinding of the workpiece 1, such as an SiC ingot or an SiC wafer peeled therefrom, on the grinding apparatus 2 will be described below, the workpiece 1 to be ground by the workpiece grinding method according to the present embodiment is not limited to such an SiC ingot or an SiC wafer peeled off therefrom.

Figure 1:
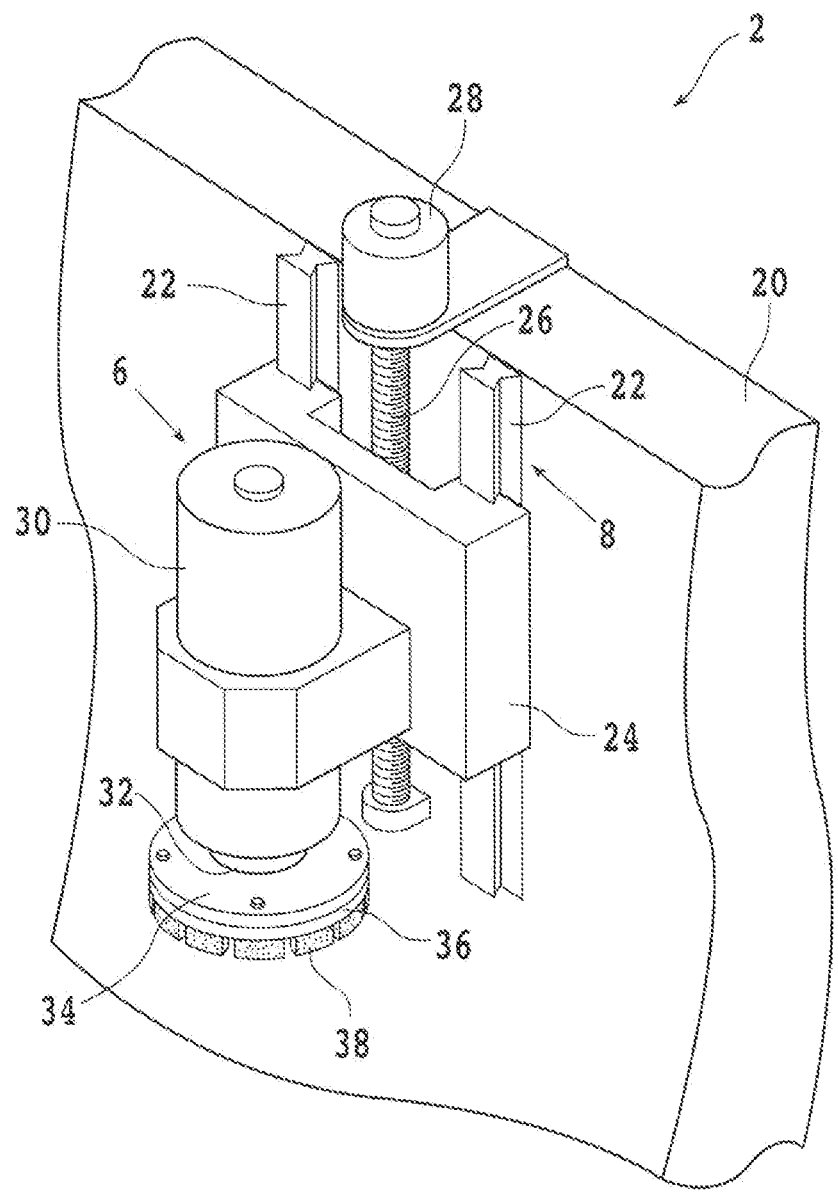
FIG. 1 is a perspective view schematically illustrating a grinding unit and a lifting and lowering unit.

The grinding apparatus 2 that carries out the workpiece grinding method according to the present embodiment will hereinafter be described. As illustrated in FIGS. 1 and 2, the grinding apparatus 2 includes a holding table 4 for holding the workpiece 1 under suction thereon, a grinding unit 6 for grinding the workpiece 1 held on the holding table 4, and a lifting and lowering unit 8 for lifting and lowering the grinding unit 6 and the holding table 4 relatively to each other. FIG. 1 schematically illustrates in perspective the grinding unit 6 and the lifting and lowering unit 8. FIG. 2 schematically illustrates in perspective the grinding unit 6 and the holding table 4 for holding the workpiece 1 under suction thereon.

The holding table 4 is disposed on a table base 12 while in use. The holding table 4 includes in its upper portion a porous member 14 that is made of ceramic or the like and that has a diameter commensurate with the diameter of the workpiece 1, for example. The porous member 14 is housed in a recess defined in a frame 16 of the holding table 4 that is disposed on the table base 12, and is exposed upwardly of the holding table 4. The frame 16 has an unillustrated suction channel that is defined therein and that has an end connected to the porous member 14 and another end connected to an unillustrated suction source. The porous member 14 has an exposed upper surface functioning as a holding surface 10 for holding the workpiece 1 under suction thereon. When the workpiece 1 is placed on the holding surface 10 of the holding table 4 and the suction source is actuated to apply a negative pressure through the suction channel and the porous member 14 to the workpiece 1, the workpiece 1 is held under suction on the holding table 4. In addition, an unillustrated rotary actuator, such as an electric motor, is coupled to the bottom of the holding table 4, i.e., the table base 12. When the rotary actuator is energized, it rotates the holding table 4 about a table axis 18 extending vertically through the center of the holding surface 10.

The lifting and lowering unit 8 vertically moves the grinding unit 6 and the holding table 4 relatively to each other along the directions in which the table axis 18 of the holding table 4 extends. The grinding apparatus 2 also includes an upstanding support wall 20 disposed in a rear portion thereof and supporting the grinding unit 6 through the lifting and lowering unit 8. The lifting and lowering unit 8 includes a pair of guide rails 22 disposed on a front surface of the support wall 20 and extending along Z-axis directions, i.e., vertical directions, and a moving plate 24 slidably mounted on the guide rails 22 for sliding movement along the guide rails 22. The moving plate 24 has an unillustrated nut disposed on a rear surface thereof that faces the support wall 20 and operatively threaded over a ball screw 26 extending vertically that is disposed between the guide rails 22 parallel thereto. The ball screw 26 has an upper end coupled to a stepping motor 28 supported on the support wall 20. When the stepping motor 28 is energized, it rotates the ball screw 26 about its central axis, causing the nut to move the moving plate 24 in the Z-axis directions along the guide rails 22. The grinding unit 6 for grinding the workpiece 1 is fixedly mounted on a front surface of the moving plate 24. When the moving plate 24 is moved in the Z-axis directions, thus, the grinding unit 6 is also moved in the same Z-axis directions that are also referred to as processing feed directions. Therefore, the lifting and lowering unit 8 has a function of lowering the grinding unit 6 toward the holding table 4 and lifting the grinding unit 6 away from the holding table 4.

The grinding unit 6 has a spindle 32 rotatable about its central axis by an unillustrated electric motor joined to an upper proximal end of the spindle 32. The electric motor is housed in a spindle housing 30. The spindle 32 has a lower distal end on which there is mounted a wheel mount 34 shaped as a circular plate. An annular grinding wheel 36 is mounted on a lower surface of the wheel mount 34 for rotation in unison with the wheel mount 34 and hence the spindle 32. The grinding wheel 36 supports on a lower surface thereof an annular array of grindstones 38. The grindstones 38 are made of abrasive grains of diamond or the like and a bonding material in which the abrasive grains are dispersed and secured. The grinding wheel 36 is rotatable about its central axis referred to as a wheel axis 40 (see FIG. 2). The wheel axis 40 extends along the directions in which the spindle 32 extends. When the electric motor housed in the spindle housing 30 is energized, the spindle 32 is thereby rotated, rotating the grinding wheel 36 about the wheel axis 40 and turning the grindstones 38 along an annular track 42 (see FIG. 5).

Figure 5:
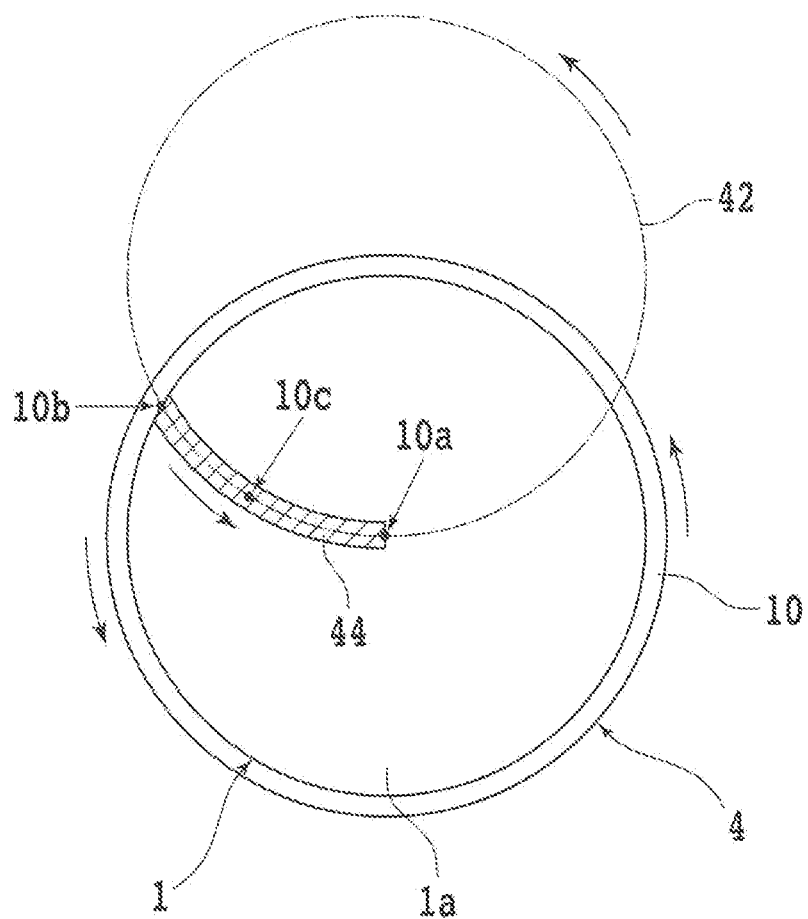
FIG. 5 is a plan view schematically illustrating the positional relation between an annular track followed by grindstones and the holding table.

FIG. 5 schematically illustrates in plan the positional relation between the annular track 42 along which the grindstones 38 are turned and the holding table 4. The holding table 4 that holds the workpiece 1 under suction on the holding surface 10 is positioned such that the holding surface 10 will have its center 10a overlapping the annular track 42 while the workpiece 1 is being ground by the grindstones 38. Therefore, the grindstones 38 move on and along the annular track 42 that extend through an area above the center 10a of the holding surface 10.

Heretofore, the holding surface 10 of the holding table 4 has been a slightly inclined conical surface, and, thus, the workpiece 1 held under suction on the holding surface 10 has been deformed into a shape complementary to the conical shape of the holding surface 10.

Heretofore, the grinding unit 6 has been lowered with the holding table 4 and the grinding wheel 36 being rotated respectively about their central axes while the generatrix of the conical holding surface 10 of the holding table 4 and the annular track 42 were kept parallel to each other. The grindstones 38 have contacted an upper surface 1a of the workpiece 1 in a grinding area extending from the center 10a of the holding surface 10 to the outer circumference thereof, thereby uniformly grinding the upper surface 1a of the workpiece 1. However, in a case where the workpiece 1 has been a hard and thick workpiece such as an SiC ingot, there has been a problem in holding the workpiece 1 under suction on the holding table 4. Specifically, since the hard and thick workpiece 1 is less likely to be deformed, even when a negative pressure is applied from the holding table 4 to the workpiece 1, the workpiece 1 has failed to be deformed into a shape complementary to the conical shape of the holding surface 10, and the negative pressure has tended to leak out through the gap between the workpiece 1 and the holding surface 10. Consequently, the workpiece 1 has failed to be held properly under suction on the holding table 4 and hence has not been ground adequately, with the result that the upper surface 1a of the workpiece 1 has not been planarized adequately.

In the workpiece grinding method according to the present embodiment, the holding surface 10 of the holding table 4 is a flat surface rather than a conical surface. The flat holding surface 10 does not require the workpiece 1 to be deformed into a conical shape when the workpiece 1 is held under suction on the holding table 4. Therefore, when the workpiece 1 that may be a hard and thick workpiece is held under suction on the holding table 4, workpiece 1 is held under suction on the holding table 4 without fault.

One approach would be to keep the table axis 18 and the wheel axis 40 parallel to each other. In this case, however, the grinding area in which the grindstones 38 contact the workpiece 1 would extend beyond an expected range on the upper surface 1a to be ground of the workpiece 1. Specifically, the grinding area would extend beyond an area between an outer circumferential end of the upper surface 1a of the workpiece 1 and the center of the upper surface 1a to an opposite outer circumferential end of the upper surface 1a. According to this approach, thus, the value of an electric current supplied to the electric motor that rotates the spindle 32 would increase and the rate at which the grindstones 38 are worn would also increase, resulting in an increase in costs for the grinding step and a reduction in the efficiency of processing the workpiece 1. Furthermore, a protruding mark referred to as a saw mark representing a contact mark left by the grindstones 38 would appear noticeably on the upper surface 1a of the workpiece 1. The saw mark would tend to lower the quality of the upper surface 1a of the workpiece 1 and would be likely to cause an uneven distribution of flexural strength in the workpiece 1.

In the workpiece grinding method according to the present embodiment, the table axis 18 and the wheel axis 40 are not kept parallel to each other. Rather, in a case where the table axis 18 extends along the Z-axis directions, i.e., the vertical directions, with the flat holding surface 10 lying horizontally, the spindle 32 is inclined from the Z-axis directions. Then, when the spindle 32 is rotated to rotate the grinding wheel 36 about the wheel axis 40, the annular track 42 followed by the grindstones 38 is inclined to the holding surface 10 of the holding table 4. In other words, the annular track 42 and the holding surface 10 do not lie parallel to each other, and hence, different locations on the annular track 42 and the holding surface 10 are not spaced from each other by a constant distance. Consequently, each of the grindstones 38 as it turns along the annular track 42 moves toward and away from the holding surface 10.

Figure 3:
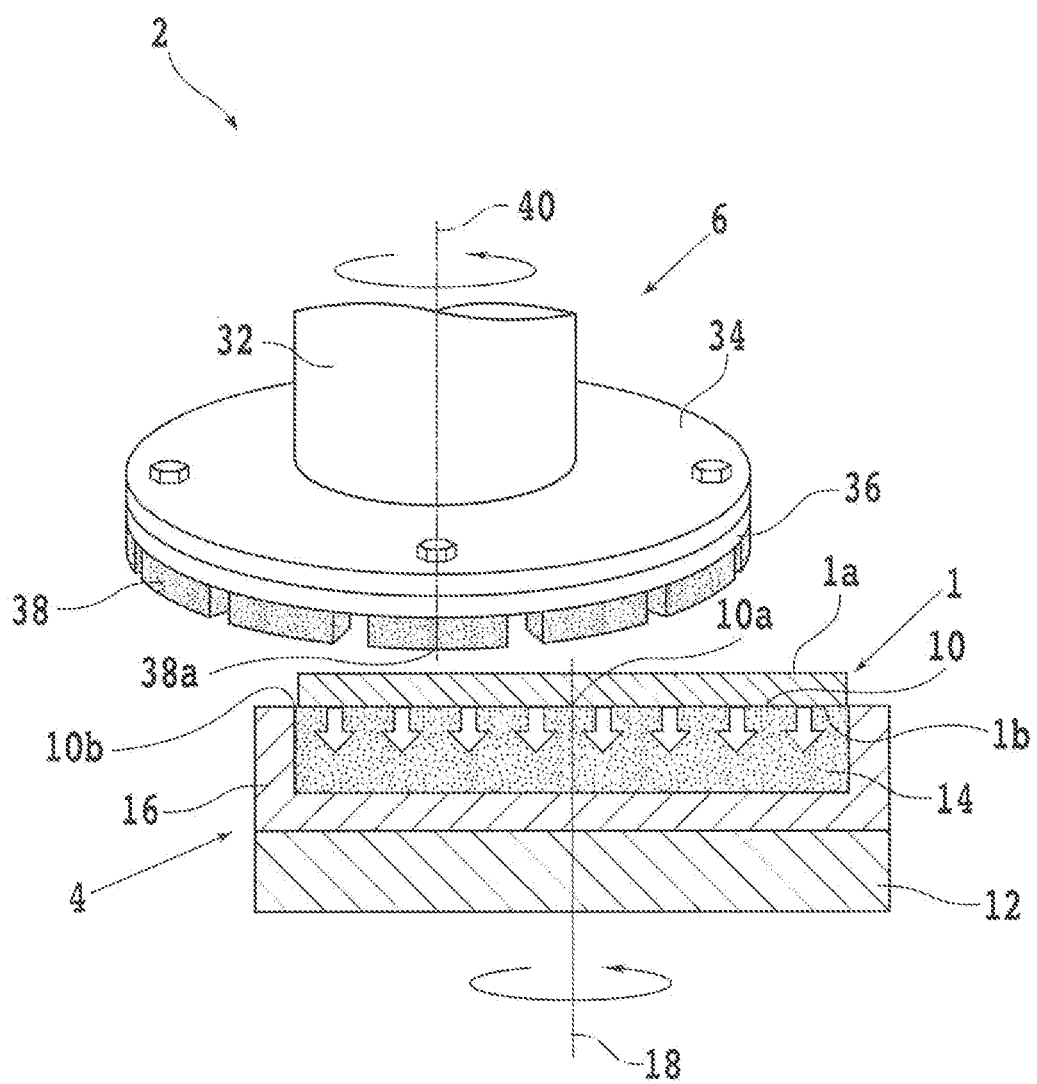
FIG. 3 is a perspective view, partly in cross section, schematically illustrating the grinding unit and the holding table for holding a workpiece under suction thereon.

FIG. 3 schematically illustrates in perspective the grinding unit 6 in a state where the wheel axis 40 is inclined to the table axis 18 and the annular track 42 is inclined to the holding surface 10. FIG. 3 also schematically illustrates in cross section the holding table 4 in that state. The relative positions of the holding table 4 and the grinding unit 6 are adjusted and the tilt of the spindle 32 is adjusted such that the annular track 42 is closest to the holding surface 10 in an area between a point above the center 10a of the holding surface 10 and a point above an outer circumferential end 10b of the holding surface 10. At this time, a lowermost spot 38a of the grindstones 38 as they turn along the annular track 42 is positioned in the area. In the workpiece grinding method according to the present embodiment, then, the grinding unit 6 is lowered to bring the grindstones 38 into grinding contact with the upper surface 1a of the workpiece 1.

There are several ways of inclining the annular track 42 followed by the grindstones 38 to the holding surface 10 of the holding table 4. For example, when the grinding unit 6 is to be fixed to the moving plate 24 of the lifting and lowering unit 8 illustrated in FIG. 1, the grinding unit 6 with the wheel axis 40 tilted from the vertical directions may be fixed to the moving plate 24. Alternatively, the grinding unit 6 with the wheel axis 40 variable in its orientation may be mounted on the moving plate 24. Furthermore, the annular track 42 may be inclined to the holding surface 10 by adjusting the orientation of the table axis 18 instead of the orientation of the wheel axis 40. For example, the holding table 4 may be supported on three shafts from below, and the lengths of at least two of the three shafts may be adjusted to change the orientation of the holding surface 10, i.e., the orientation of the table axis 18.

Figure 4:
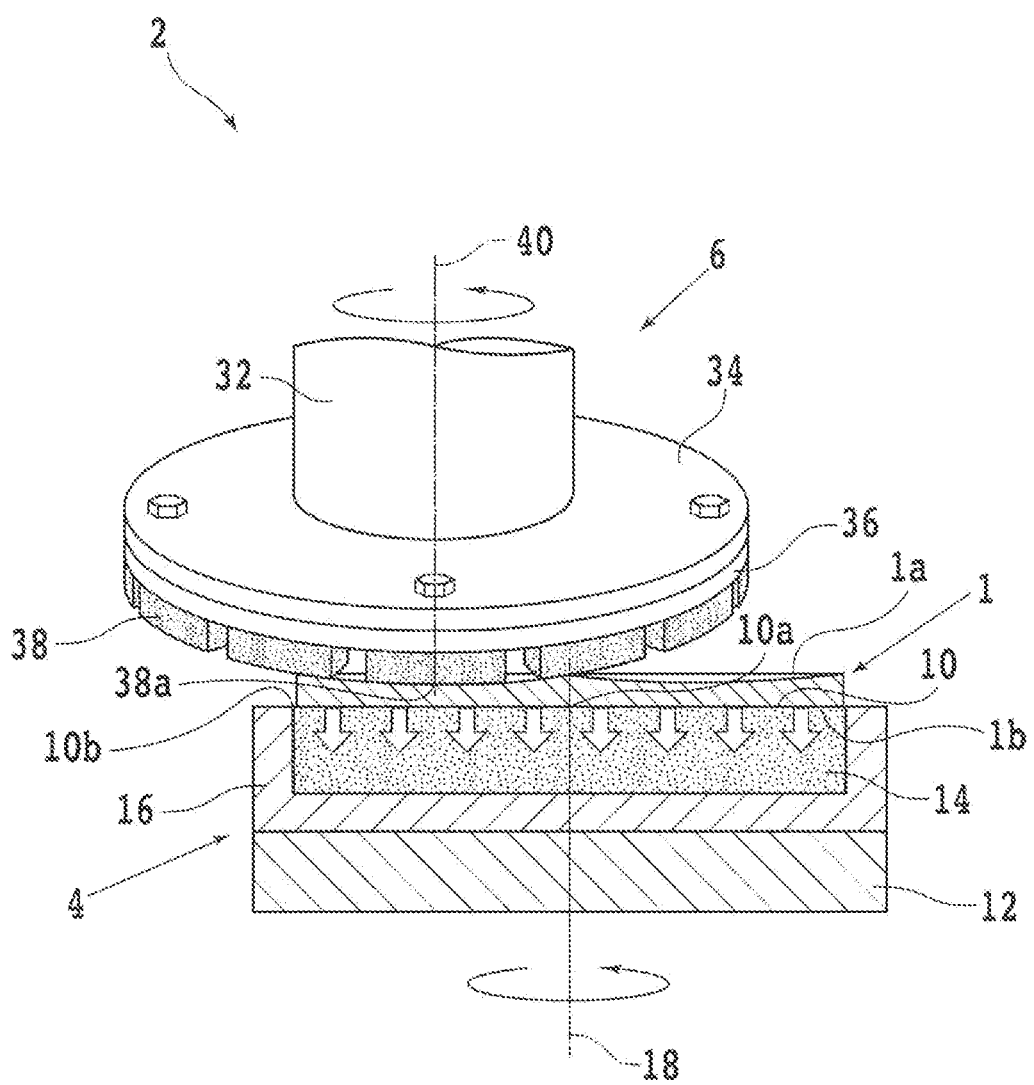
FIG. 4 is a perspective view, partly in cross section, schematically illustrating the manner in which the workpiece is ground by the grinding unit.

FIG. 4 schematically illustrates in perspective the grinding unit 6 for grinding the workpiece 1. FIG. 4 also schematically illustrates in cross section the holding table 4 for holding the workpiece 1 to be ground under suction thereon. When the workpiece 1 is to be ground by the grinding unit 6, the grinding unit 6 is lowered to bring the grindstones 38 into grinding contact with the upper surface 1a of the workpiece 1 at the lowermost spot 38a. As the grinding unit 6 is further lowered, an area where the grindstones 38 abut against the upper surface 1a, i.e., a grinding area, spreads along the annular track 42. Then, the grindstones 38 contact the upper surface 1a of the workpiece 1 in the area between the point above the center 10a of the holding surface 10 and the point above the outer circumferential end 10b of the holding surface 10. On the other hand, the grindstones 38 do not contact the upper surface 1a of the workpiece 1 outside that area. Consequently, even though the holding surface 10 is flat instead of being conical, the area where the grindstones 38 abut against the upper surface 1a of the workpiece 1, i.e., the grinding area, remains the same as if the holding surface 10 were conical. The grinding unit 6 is thus able to grind the upper surface 1a of the workpiece 1 in its entirety as with the conventional art.

Figure 6A:
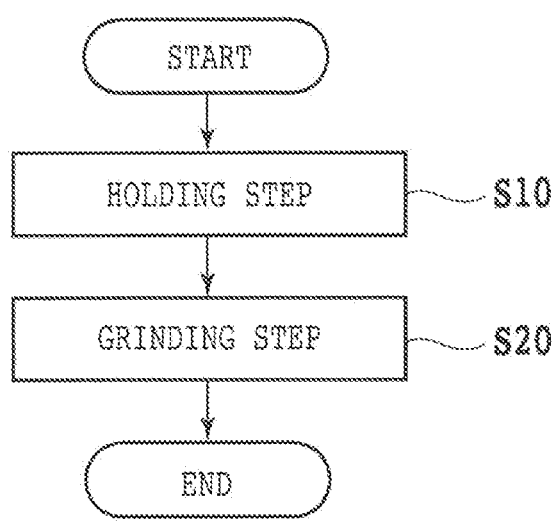
FIG. 6A is a flowchart of a sequence of steps of a method of grinding a workpiece according to an embodiment of the present invention.

Steps of the workpiece grinding method according to the present embodiment will be described below. FIG. 6A is a flowchart of a sequence of steps of the workpiece grinding method according to the present embodiment. In the workpiece grinding method, holding step S10 is carried out at first to hold the workpiece 1 on the flat holding surface 10 of the holding table 4. Next, grinding step S20 is carried out to grind the workpiece 1 held on the holding surface 10.

First, holding step S10 will be described below. In holding step S10, the workpiece 1 is delivered onto the holding surface 10 of the holding table 4. At this time, the upper surface 1a to be ground of the workpiece 1 faces upwardly, and a lower surface 1b thereof faces downwardly opposite the holding surface 10. Thereafter, the suction source of the holding table 4 is actuated to apply a negative pressure through the porous member 14 to the workpiece 1, holding the workpiece 1 under suction on the holding surface 10. Since the holding surface 10 is flat, even if the workpiece 1 is a hard and thick workpiece such as an SiC ingot, the holding table 4 adequately holds the workpiece 1 under suction on the holding surface 10 without fault. In the workpiece grinding method according to present embodiment, the workpiece 1 is not limited to a hard and thick workpiece such as an SiC ingot, and may be a wafer having a plurality of devices formed on a face side thereof. If the workpiece 1 is such a wafer, then a reverse side of the wafer with no devices formed thereon is treated as the upper surface 1a, whereas the face side of the wafer with the devices formed thereon is treated as the lower surface 1b. A protective tape may be affixed to the face side in order to protect the devices on the face side.

Next, grinding step S20 will be described below. In grinding step S20, the grinding wheel 36 is rotated about the wheel axis 40 to turn the grindstones 38 along the annular track 42, and the holding table 4 is rotated about the table axis 18. The lifting and lowering unit 8 then brings the grinding unit 6 and the holding table 4 relatively toward each other until the grindstones 38 abut against the upper surface 1a of the workpiece 1, starting grinding of the workpiece 1. When the grindstones 38 contact and grind the workpiece 1, swarf is produced from the workpiece 1 and the grindstones 38 and heat is generated therefrom, increasing the temperature of the workpiece 1. In order to quickly remove the swarf and temperature from the workpiece 1, etc., the workpiece 1, etc. is supplied with a fluid called a grinding fluid when the workpiece 1 is ground by the grindstones 38. The grinding fluid may be pure water, for example.

The grinding apparatus 2 may include an unillustrated thickness measuring unit for measuring the thickness of the workpiece 1 as it is being ground. The thickness measuring unit has a probe for contacting the upper surface 1a of the workpiece 1, for example. When the thickness measuring unit is used, it can measure and monitor the thickness of the workpiece 1 as it is being thinned during grinding step S20, and can also detect that the workpiece 1 has reached a predetermined thickness.

The relation between the annular track 42 along which the grindstones 38 are turned and the holding surface 10 of the holding table 4 in grinding step S20 will be described in detail below. As described above, FIG. 5 schematically illustrates in plan the relationship between the holding surface 10 of the holding table 4 and the annular track 42. Specifically, FIG. 5 schematically illustrates in plan the annular track 42 along which the grindstones 38 are turned at the time the grinding wheel 36 is rotated about the wheel axis 40. In grinding step S20, the grindstones 38 as they are turned along the annular track 42 pass through the area between the point above the center 10a of the holding surface 10 and the point above the outer circumferential end 10b of the holding surface 10. As described above, the annular track 42 is inclined to the holding surface 10 of the holding table 4. In grinding step S20, the grindstones 38 abut against the upper surface 1a of the workpiece 1 while the annular track 42 is closest to the holding surface 10 in the area between the point above the center 10a of the holding surface 10 and the point above the outer circumferential end 10b of the holding surface 10.

Preferably, in grinding step S20, the position of the spindle 32 and the tilt of the wheel axis 40 are established such that the annular track 42 is closest to the holding surface 10 at an intermediate point 10c between the point above the center 10a of the holding surface 10 and the point above the outer circumferential end 10b of the holding surface 10. In this case, a contact area 44, i.e., a grinding area 44, where the grindstones 38 and the upper surface 1a of the workpiece 1 contact each other can be established between the point above the center 10a of the holding surface 10 and the point above the outer circumferential end 10b of the holding surface 10. This means that the contact area 44 that is similar to a contact area in a case where the workpiece 1 is ground while being held on the holding table 4 with the conventional conical holding surface 10 is realized in grinding step S20. In other words, in grinding step S20, the upper surface 1a of the workpiece 1 is ground in its entirety efficiently to a high-quality finish.

Heretofore, in a case where the holding surface 10 of the holding table 4 is a conical surface, the table axis 18 and the wheel axis 40 do not extend parallel to each other, but their extensions cross each other. In the workpiece grinding method according to the present embodiment, the table axis 18 and the wheel axis 40 do not extend parallel to each other nor do their extensions cross each other. FIG. 4 schematically illustrates in cross section the workpiece 1 that is ground in grinding step S20. When the upper surface 1a of the workpiece 1 is ground by the grindstones 38 as they are turned along the annular track 42 while changing their heights, an annular cavity is formed in the upper surface 1a of the workpiece 1 between the center and the outer circumferential edge thereof. The larger the angle between the annular track 42 and the holding surface 10, i.e., the tilt of the wheel axis 40 from the vertical directions, becomes, the deeper the annular cavity formed in the upper surface 1a of the workpiece 1 becomes.

If the angle between the annular track 42 and the holding surface 10 is too large, then the thickness of the workpiece 1 tends to become uneven excessively. If the angle between the annular track 42 and the holding surface 10 is too small, making the annular track 42 and the holding surface 10 substantially parallel to each other, then the grinding area tends to extend beyond the area between the outer circumferential end of the upper surface 1a of the workpiece 1 and the center of the upper surface 1a to the opposite outer circumferential end of the upper surface 1a, posing problems on the grinding of the workpiece 1. Stated otherwise, the angle between the annular track 42 and the holding surface 10 should be of a value in a preferable range. The magnitude of the angle is represented by the difference between the distance between the grindstones 38 and the holding surface 10 at the time the grindstones 38 as they are turned along the annular track 42 are closest to the holding surface 10 and the distance between the grindstones 38 and the holding surface 10 at the time the grindstones 38 are farthest from the holding surface 10. In a case where the grinding wheel 36 used is of a diameter of 200 mm, the difference between the above distances should preferably be in a range from 5 to 50 μm, and more preferably be of 20 μm. In FIG. 4 and other figures, for illustrative purposes, the tilt of the annular track 42 followed by the grindstones 38 mounted on the grinding wheel 36 with respect to the holding surface 10 of the holding table 4 is illustrated as exaggerated, and the shape of the annular cavity formed in the upper surface 1a of the workpiece 1 is also illustrated as exaggerated. In other words, the tilt of the annular track 42 and the shape of the annular cavity are not limited to those illustrated.

In the workpiece grinding method according to the present embodiment, as the annular cavity is formed in the upper surface 1a to be ground of the workpiece 1, the upper surface 1a is not made completely flat. However, inasmuch as the upper surface 1a is ground by contact with the grindstones 38, minute surface irregularities that have been present on the upper surface 1a before being ground are removed when the upper surface 1a is ground by the grindstones 38. Stated otherwise, when the workpiece grinding method according to the present embodiment is performed on the workpiece 1, the upper surface 1a thereof with the minute surface irregularities is ground into a surface with reduced surface roughness. In the present description, a process of removing minute surface irregularities from a surface to be ground may be referred to as planarization. When a laser beam is applied to the upper surface 1a with reduced surface roughness and converged at a predetermined depth in the workpiece 1, the laser beam is less likely to be disturbed by the upper surface 1a. In a case where the workpiece 1 is an SiC ingot, for example, the laser beam can be converged at a predetermined depth in the SiC ingot to form modified layers as desired in the SiC ingot. Therefore, a peel-off surface from which an SiC wafer is to be peeled off from the SiC ingot can be formed highly accurately in the SiC ingot.

In the workpiece grinding method according to the present embodiment, as described above, even if the workpiece 1 to be ground is a hard and thick workpiece, the workpiece 1 can be held under suction on the holding table 4 without fault, and the upper surface 1a of the workpiece 1 can be ground uniformly efficiently to a high-quality finish. According to the present invention, the workpiece 1 is not limited to any particular types, and even if the workpiece 1 is not hard and is thin, the workpiece 1 can be ground to a high-quality finish.

Figure 6B:
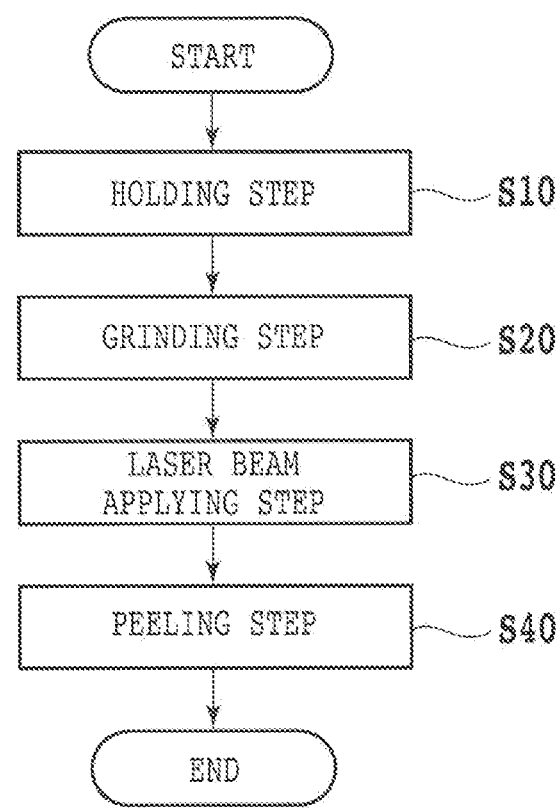
FIG. 6B is a flowchart of a sequence of steps of a method of manufacturing an SiC wafer.

Next, a method of grinding an SiC ingot, e.g., a hexagonal single crystal ingot, on the grinding apparatus 2 and cutting off an SiC wafer from the SiC ingot at a predetermined depth from a distal end thereof will be described below. FIG. 6B is a flowchart of a sequence of steps of a method of manufacturing an SiC wafer, also referred to as an SiC wafer manufacturing method. In the SiC wafer manufacturing method illustrated in FIG. 6B, an SiC wafer shaped as a circular plate is produced from a cylindrical SiC ingot that is cut off by a wire saw or the like from a distal end portion of a cylindrical ingot growth base grown from an SiC seed crystal and having a growth end face on its distal end. In the SiC wafer manufacturing method, a laser beam is converged at a predetermined depth in the SiC ingot to form modified layers including cracks in the SiC ingot, and an SiC wafer is cut off from the SiC ingot along the modified layers that act as a peel-off starting point.

Figure 7A:
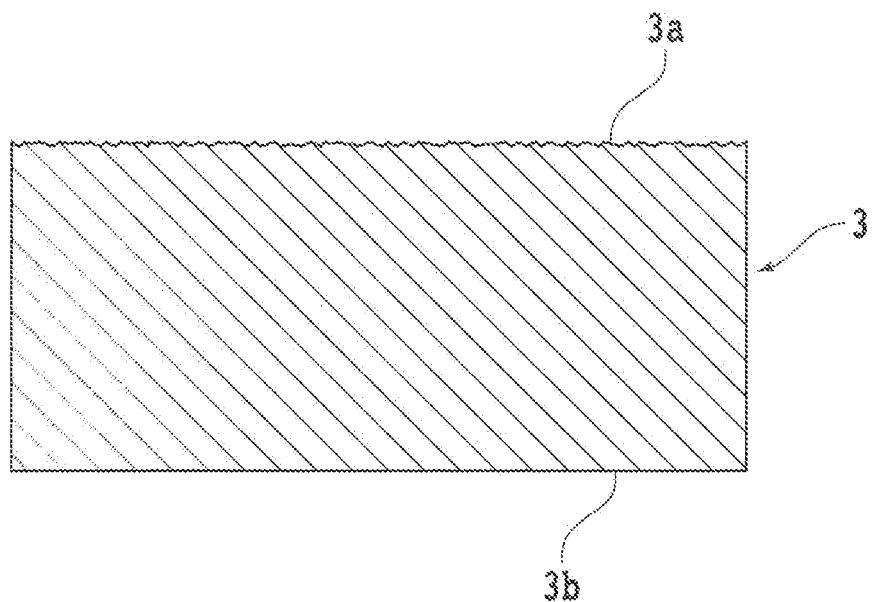
FIG. 7A is a cross-sectional view schematically illustrating a workpiece to be ground.
Figure 7B:
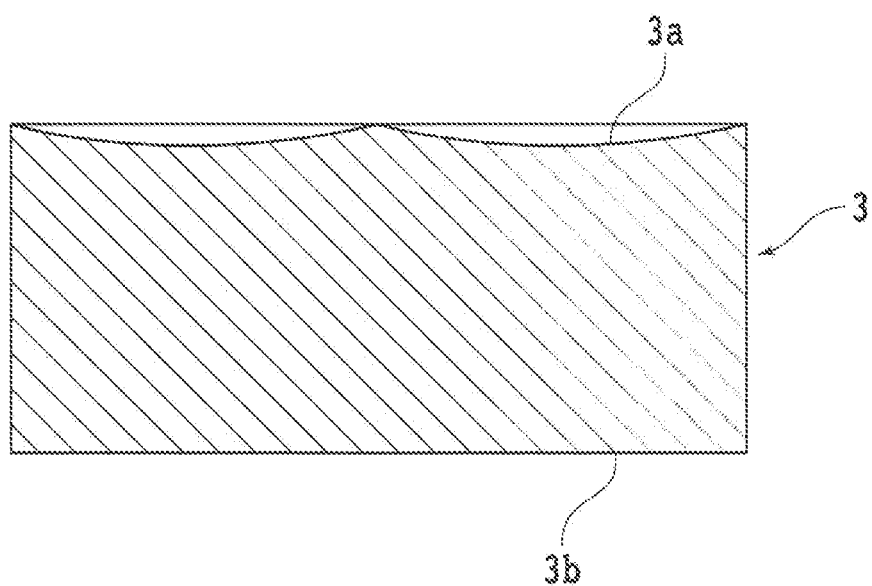
FIG. 7B is a cross-sectional view schematically illustrating the workpiece that has been ground.

In the SiC wafer manufacturing method, first, an SiC ingot 3 (see FIG. 7A) as a workpiece is ground to remove minute surface irregularities from an upper surface 3a thereof. FIG. 7A schematically illustrates in cross section the SiC ingot 3 with minute surface irregularities on the upper surface 3a. In the SiC wafer manufacturing method, as with the workpiece grinding method, holding step S10 and grinding step S20 are carried out. Details of holding step S10 and grinding step S20 have been described in detail above, and will not be described below. If not only the upper surface 3a of the SiC ingot 3, but also a lower surface 3b thereof, are to be ground, then after the upper surface 3a of the SiC ingot 3 has been ground, the SiC ingot 3 is vertically inverted, and holding step S10 and grinding step S20 are carried out again. FIG. 7B schematically illustrates in cross section the SiC ingot 3 that has been ground to remove minute surface irregularities from the upper surface 3a. As illustrated in FIG. 7B, an annular cavity is formed in the upper surface 3a of the SiC ingot 3 between the center and the outer circumferential edge thereof, while minute surface irregularities which would otherwise tend to disturb a laser beam to be described later are removed from the upper surface 3a.

Figure 8A:
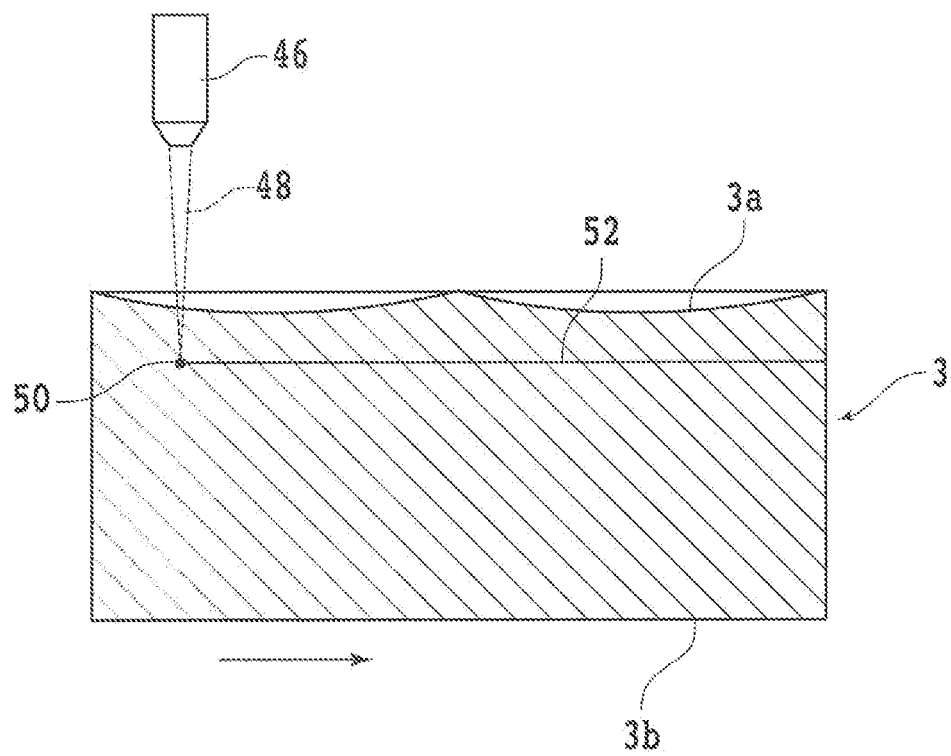
FIG. 8A is a cross-sectional view schematically illustrating the manner in which modified layers are being formed in the workpiece.

In the SiC wafer manufacturing method, next, laser beam applying step S30 is carried out. FIG. 8A schematically illustrates in cross section the manner in which laser beam applying step S30 is carried out. In laser beam applying step S30, a laser beam having a wavelength transmittable through SiC, i.e., a wavelength that can transmit SiC, is applied to the SiC ingot 3. In laser beam applying step S30, there is used a laser processing apparatus including a laser processing unit 46 that is capable of converging a laser beam 48 having a wavelength of 1064 nm oscillated through a medium of neodymium-doped yttrium aluminum garnet (Nd:YAG), for example, at a predetermined depth in the SiC ingot 3.

In laser beam applying step S30, a converged spot 50 of the laser beam 48 is positioned in the SiC ingot 3 at a depth corresponding to the thickness of an SiC wafer to be produced from the SiC ingot 3. Then, while the laser beam 48 is being applied to the SiC ingot 3, the SiC ingot 3 and the laser processing unit 46 are processing-fed in a horizontal direction relatively to each other. By thus scanning the SiC ingot 3 with the laser beam 48, modified layers 52 are formed in the SiC ingot 3 at the depth referred to above. The modified layers 52 act as a peel-off starting point.

When the laser beam 48 is converged at the converged spot 50, if the upper surface 3a, to which the laser beam 48 is to be applied, of the SiC ingot 3 has minute surface irregularities and hence has large surface roughness, then the laser beam 48 is disturbed by the upper surface 3a. The disturbed laser beam 48 fails to be converged adequately at the predetermined depth with a predetermined intensity, and is unable to form desired modified layers 52 in the SiC ingot 3. Consequently, an SiC wafer cannot adequately be peeled off from the SiC ingot 3. Even if an SiC wafer is peeled off from the SiC ingot 3, peel-off surfaces of the SiC wafer and the SiC ingot 3 are roughened to a large extent. Those roughened peel-off surfaces have to be ground with a high level of grinding strength, resulting in a large amount of SiC loss as swarf, so that the efficiency of manufacturing SiC wafers from the SiC ingot 3 is reduced.

On the other hand, according to the present embodiment, since grinding step S20 is carried out prior to laser beam applying step S30, minute surface irregularities are removed from the upper surface 3a of the SiC ingot 3, and hence the laser beam 48 is less likely to be disturbed by the upper surface 3a. Therefore, modified layers 52 of desired quality are formed in the SiC ingot 3, and an SiC wafer can adequately be peeled off from the SiC ingot 3.

Figure 8B:
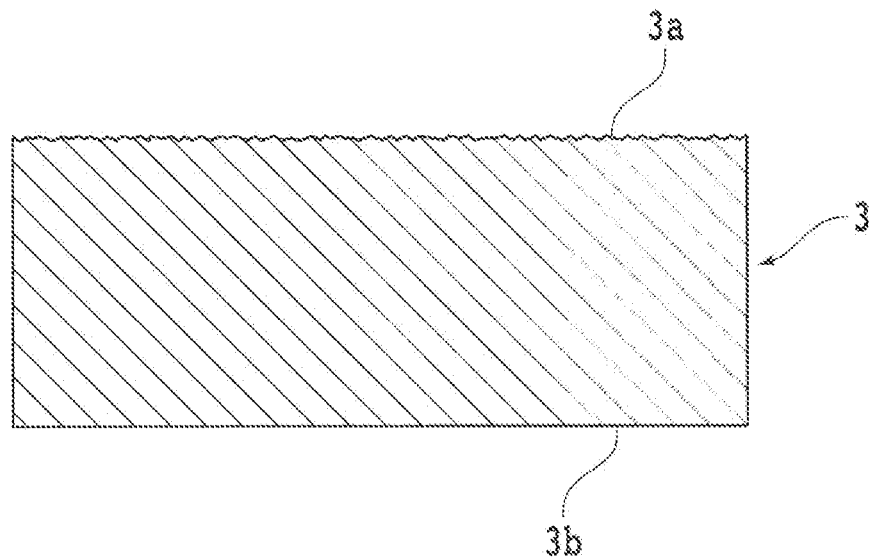
FIG. 8B is a cross-sectional view schematically illustrating the workpiece from which a wafer has been peeled off.

In the SiC wafer manufacturing method, next, peeling step S40 is carried out. In peeling step S40, the SiC ingot 3 is divided along the modified layers 52 acting as the peel-off starting point, peeling off an unillustrated SiC wafer from the SiC ingot 3. In this manner, the SiC wafer is manufactured. Inasmuch as desired modified layers 52 are formed at the predetermined depth in the SiC ingot 3 in the SiC wafer manufacturing method, SiC wafers can efficiently be manufactured from the SiC ingot 3. FIG. 8B schematically illustrates in cross section the SiC ingot 3 left after the SiC wafer has been peeled off therefrom. The SiC ingot 3 that has been left is used to manufacture a next SiC wafer therefrom. However, a new upwardly exposed upper surface 3a of the SiC ingot 3 may have minute surface irregularities due to the modified layers 52 previously formed in the SiC ingot 3. For manufacturing a next SiC wafer from the SiC ingot 3 illustrated in FIG. 8B, consequently, it is preferable to carry out holding step S10 and grinding step S20 to grind the new upper surface 3a.

The present invention is not limited to the embodiment described above, and various changes and modifications may be made in the embodiment. According to the above embodiment, for example, the workpiece 1 is illustrated as an SiC ingot, e.g., a hexagonal single crystal ingot. However, the workpiece 1 is not limited to such an SiC ingot and is not limited to a hard and thick workpiece either.

For example, a relatively thin SiC wafer cut off from an SiC ingot by a wire saw may be used as the workpiece 1. Since minute surface irregularities are formed on the cut surface of the SiC wafer cut off from the SiC ingot by the wire saw, the flexural strength of the SiC wafer may be lowered if the minute surface irregularities remain unremoved. In addition, devices may not adequately be formed on a surface of a SiC wafer cut off from an SiC ingot by a wire saw if the surface has minute surface irregularities thereon. Therefore, the workpiece grinding method according to the above embodiment may be performed on an SiC wafer manufactured without the application of a laser beam, as the workpiece 1. If the cut surface of an SiC wafer cut off from an SiC ingot by a wire saw is ground, minute surface irregularities on the cut surface are removed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of grinding a workpiece on a grinding apparatus including
   a holding table having on an upper portion thereof a holding surface for holding the workpiece under suction thereon, the holding table being rotatable about a table axis extending through a center of the holding surface and the holding surface being planar across the entire holding surface,
   a grinding unit disposed above the holding table, the grinding unit having a grinding wheel with an annular array of grindstones for grinding the workpiece held on the holding table and an electric motor for rotating the grinding wheel about a wheel axis, the grindstones being turned along an annular track overlapping the center of the holding surface when the electric motor rotates the grinding wheel, and
   a lifting and lowering unit for moving the grinding unit relative to the holding table along a direction in which the table axis extends,
   the method comprising:
      a holding step of holding the workpiece on the holding surface of the holding table, wherein the holding surface is flat; and
      a grinding step of rotating the grinding wheel about the wheel axis to turn the grindstones along the annular track while rotating the holding table about the table axis, and actuating the lifting and lowering unit to move the grinding unit toward the holding table until the grindstones are brought into grinding contact with an upper surface of the workpiece to thereby grind the workpiece,
   wherein the annular track is inclined to the holding surface of the holding table, and the grinding step includes the step of bringing the grindstones into grinding contact with the upper surface of the workpiece in a state where the annular track is closest to the holding surface in an area between a point above the center of the holding surface and a point above an outer circumferential end of the holding surface.

2. The method of grinding the workpiece according to claim 1, wherein, in the grinding step, the annular track is closest to the holding surface at an intermediate point between the point above the center of the holding surface and the point above the outer circumferential end of the holding surface.

3. The method of grinding the workpiece of claim 1, fixing the grinding unit to a moving plate of the lifting and lowering unit such that the wheel axis of the grinding unit is inclined relative to the table axis of the holding table.

4. The method of grinding the workpiece of claim 1, adjusting the orientation of the table axis of the holding table relative to the wheel axis of the grinding unit so that the holding table is inclined relative to the grinding unit.

* * * * *

UNITED STATES PATENT AND TRADEMARK OFFICE
CERTIFICATE OF CORRECTION

PATENT NO. : 11,813,717 B2
APPLICATION NO. : 17/118741
DATED : November 14, 2023
INVENTOR(S) : Yujiro Sudo It is certified that error appears in the above-identified patent and that said Letters Patent is hereby corrected as shown below:

In the Claims

In Column 14, Line 8, delete "the step of".

Signed and Sealed this
Twenty-third Day of January, 2024

Katherine Kelly Vidal
*Director of the United States Patent and Trademark Office*